(12) United States Patent
Huang

(10) Patent No.: US 11,145,681 B2
(45) Date of Patent: Oct. 12, 2021

(54) DISPLAY PANEL AND DISPLAY DEVICE APPLYING THE SAME

(71) Applicant: HKC CORPORATION LIMITED, Guangdong (CN)

(72) Inventor: Beizhou Huang, Chongqing (CN)

(73) Assignee: HKC CORPORATION LIMITED, Shenzhen (CN)

( * ) Notice: Subject to any disclaimer, the term of this patent is extended or adjusted under 35 U.S.C. 154(b) by 0 days.

(21) Appl. No.: 16/758,127

(22) PCT Filed: Dec. 13, 2017

(86) PCT No.: PCT/CN2017/115839
§ 371 (c)(1),
(2) Date: Apr. 22, 2020

(87) PCT Pub. No.: WO2019/080290
PCT Pub. Date: May 2, 2019

(65) Prior Publication Data
US 2020/0286922 A1 Sep. 10, 2020

(30) Foreign Application Priority Data

Oct. 26, 2017 (CN) .......................... 201711016878.4

(51) Int. Cl.
*H01L 27/12* (2006.01)
*H05K 1/18* (2006.01)
*G02F 1/1345* (2006.01)

(52) U.S. Cl.
CPC ........... *H01L 27/124* (2013.01); *H05K 1/189* (2013.01); *G02F 1/13452* (2013.01); *H05K 2201/09227* (2013.01); *H05K 2201/10128* (2013.01)

(58) Field of Classification Search
CPC .................. H01L 27/124; H05K 1/189; H05K 2201/09227; H05K 2201/09236;
(Continued)

(56) References Cited

U.S. PATENT DOCUMENTS

2001/0020995 A1    9/2001   Kim
2004/0056331 A1*   3/2004   Chen ................... G02F 1/13452
                                                          257/629

(Continued)

FOREIGN PATENT DOCUMENTS

CN          1484067 A      3/2004
CN        103558703 A      2/2014
(Continued)

*Primary Examiner* — Hoa C Nguyen
(74) *Attorney, Agent, or Firm* — Muncy, Geissler, Olds and Lowe, P.C.

(57) ABSTRACT

A display panel and a display device are provided. The display panel includes: a first substrate including a display area and a wiring area, wherein a plurality of active switches and a plurality of pixel units are disposed in the display area of the first substrate, and the pixel units are respectively coupled to the active switches; a second substrate disposed opposite the first substrate; a first drive line portion disposed in the wiring area of the first substrate; a second drive line portion disposed in the wiring area of the first substrate; a flexible circuit board including a first wire; and a first interface unit respectively connecting the first wire to the first drive line portion and the second drive line portion. The flexible circuit board comprises a second wire, and the second wire is connected to the first wire in parallel to form parallel circuits.

19 Claims, 12 Drawing Sheets

(58) Field of Classification Search
CPC .......... H05K 2201/09245; H05K 2201/09254; G02F 1/13452
See application file for complete search history.

(56) References Cited

U.S. PATENT DOCUMENTS

| | | | | |
|---|---|---|---|---|
| 2012/0188223 | A1* | 7/2012 | Leng | G09G 3/3648 345/212 |
| 2016/0148588 | A1* | 5/2016 | Huang | G02F 1/13454 345/100 |
| 2017/0269411 | A1* | 9/2017 | Liu | H01L 21/78 |
| 2017/0288009 | A1* | 10/2017 | Kim | H01L 51/52 |

FOREIGN PATENT DOCUMENTS

| | | |
|---|---|---|
| CN | 104216182 A | 12/2014 |
| CN | 107065332 A | 8/2017 |
| CN | 107111971 A | 8/2017 |

* cited by examiner

DISPLAY PANEL AND DISPLAY DEVICE APPLYING THE SAME

BACKGROUND

Technical Field

This disclosure relates to a circuit structure of a display, and more particularly to a wire on array (WOA) of a display panel and a display device applying the same.

Related Art

Recently, liquid crystal displays (LCDs) have the wide applications. With the improvement of the driving technology, the LCD has advantages of the low electrical power consumption, the thin and light properties, the low voltage driving property and the like. At present, the LCD has been widely applied to the video recorder/player, notebook computer, desktop display and various projection apparatuses.

When the panel of the active switch-liquid crystal display (or TFT-LCD) is normally displaying, a gate driver needs to be combined with a gate line, a source driver needs to be combined with a data line and to work in conjunction with a color filter common electrode (CF Com) and a storage electrode. A pixel electrode signal is supplied through the data line after the active switch (TFT) turns on. A storage electrode signal is supplied from an array common line (AA Com) around an effective display area to form a storage capacitor (Cst) between it and the pixel electrode. A color filter common electrode signal is supplied from a common voltage line of the wire on array (WOA) of the array substrate to the color filter substrate. A liquid crystal capacitor (Clc) is formed between the color filter common electrode and the pixel electrode.

In order to save the cost, the circuits including the gate driver, the gate lines and the data lines are formed on the same display substrate, and then the WOA is utilized to connect the display substrate to the chip on film (COF) for transmitting the gate drive signal. In general, the WOA includes: the type A trace for providing the common voltage to the color filter substrate; the type B trace for providing the power drive signal to the chip; and the type C trace for providing the work signal to the chip. However, a signal of the gate line is transferred to each layer of chip and integrated circuit (IC) in a layer-by-layer manner through the WOA. Thus, the power drive signal provided to the chip/integrated circuit through the type B trace cannot have the serious distortion. In the design, the resistance value of the type B trace for the chips/integrated circuits needs to be decreased.

However, with the requirement of the border of the display panel getting narrower and narrower, the WOA space is getting smaller and smaller, and this also makes the wiring spaces of the drive traces of the chips/integrated circuits become smaller and smaller, and the trace is getting thinner and thinner and longer and longer. The corresponding impedance value gets larger. Not only the drive signal gets distorted seriously, but also the display homogeneity of the display panel is affected.

SUMMARY

In order to solve the above-mentioned technical problems, an objective of this disclosure is to provide a display panel capable of decreasing the resistance value of the type B trace of the WOA in the narrow border, enhancing the product quality and the product reliability, and lengthening the lifetime.

The objective of this disclosure and the solution of the technical problem can be implemented by the following technical solutions. This disclosure provides a display panel includes: a first substrate including a display area and a wiring area, wherein a plurality of active switches and a plurality of pixel units are disposed in the display area of the first substrate, and the pixel units are respectively coupled to the active switches; a second substrate disposed opposite the first substrate; a first drive line portion disposed in the wiring area of the first substrate; a second drive line portion disposed in the wiring area of the first substrate; a flexible circuit board including a first wire; and a first interface unit respectively connecting the first wire to the first drive line portion and the second drive line portion. The flexible circuit board comprises a second wire, and the second wire is connected to the first wire in parallel to form parallel circuits.

This disclosure further includes the following technical solutions for solving the technical problem.

In one embodiment of the disclosure, the second wire is respectively electrically coupled to a plurality of virtual bit interface units and the first interface unit.

In one embodiment of the disclosure, the second wire is electrically coupled to the virtual bit interface units and the first interface unit by way of single-layer metal wiring or dual-layer metal wiring.

In one embodiment of the disclosure, the first drive line portion comprises a first circuit lead and a second circuit lead, and the second drive line portion comprises a first circuit lead and a second circuit lead. The first wire bridges the second circuit lead of the first drive line portion and the first circuit lead of the second drive line portion. The first circuit lead of the first drive line portion and the second circuit lead of the second drive line portion are electrically coupled to the virtual bit interface units through a second interface unit.

In one embodiment of the disclosure, the second interface unit and the virtual bit interface units are configured by way of single-layer metal wiring or dual-layer metal wiring.

In one embodiment of the disclosure, when the first wire bridges the first drive line portion and the second drive line portion, an edge of the first substrate is located between the first drive line portion and the first interface unit, and between the second drive line portion and the first interface unit.

In one embodiment of the disclosure, the first drive line portion and the second drive line portion are electrically coupled to a drive chip, and the drive chip is a source drive chip or a gate drive chip.

In one embodiment of the disclosure, the drive chip is disposed on the flexible circuit board.

In one embodiment of the disclosure, the display panel further includes a plurality of third drive line portions electrically coupled to the virtual bit interface units to form parallel circuits with the first drive line portion and the second drive line portion.

In one embodiment of the disclosure, the first drive line portion and the second drive line portion are respectively electrically coupled to a plurality of impedance decreasing wires through the first interface unit and the second interface unit.

In one embodiment of the disclosure, the flexible circuit board is a flexible printed circuit film or a flexible printed circuit board.

In one embodiment of the disclosure, materials of the first interface unit and the virtual bit interface units are selected from a group consisting of aluminum, molybdenum, chromium and alloys of aluminum, molybdenum and chromium.

In one embodiment of the disclosure, a material of the second interface unit is selected from a group consisting of aluminum, molybdenum, chromium and alloys of aluminum, molybdenum and chromium.

The disclosure also provides a display device including a control component and a display panel according to any of the above embodiments.

The disclosure further provides a display panel including: a first substrate including a display area and a wiring area, wherein a plurality of active switches and a plurality of pixel units are disposed in the display area of the first substrate, and the pixel units are respectively coupled to the active switches; a second substrate disposed opposite the first substrate; a first drive line portion disposed in the wiring area of the first substrate; a second drive line portion disposed in the wiring area of the first substrate; a flexible circuit board including a first wire and a second wire, wherein the second wire is connected to the first wire in parallel to form parallel circuits; and a first interface unit respectively connecting the first wire to the first drive line portion and the second drive line portion. The first drive line portion comprises a first circuit lead and a second circuit lead, and the second drive line portion comprises a first circuit lead and a second circuit lead. The first wire bridges the second circuit lead of the first drive line portion and the first circuit lead of the second drive line portion. The first circuit lead of the first drive line portion and the second circuit lead of the second drive line portion are electrically coupled to the virtual bit interface units through a second interface unit. The first drive line portion and the second drive line portion are respectively electrically coupled to a plurality of impedance decreasing wires through the first interface unit and the second interface unit. A plurality of third drive line portions are electrically coupled to the virtual bit interface units to form parallel circuits with the first drive line portion and the second drive line portion.

This disclosure can decrease the resistance value of the type B trace of the WOA in the narrow border, enhance the product quality and the product reliability, and lengthen the lifetime.

DETAILED DESCRIPTION OF THE INVENTION

Figure 1A:
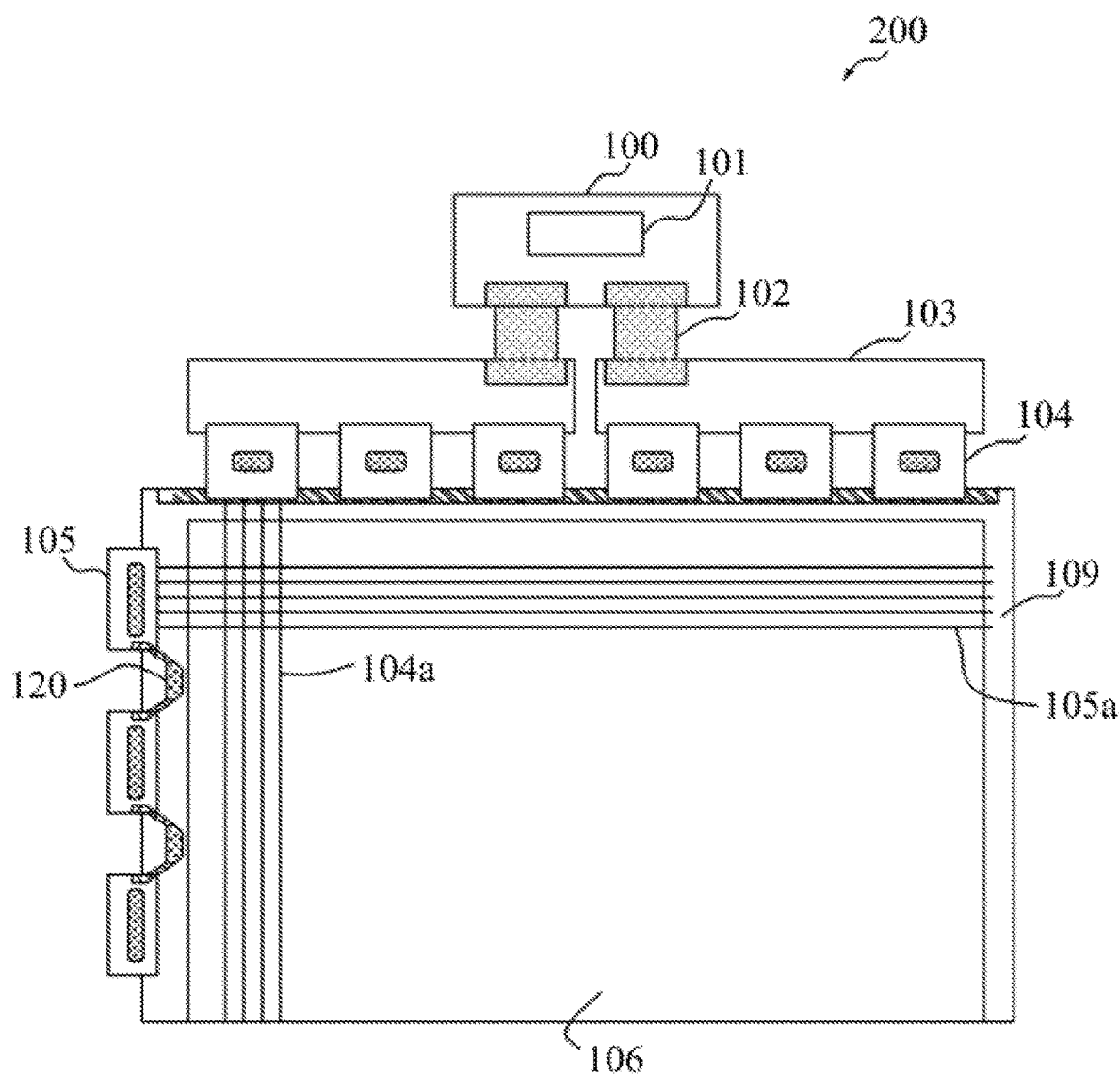
FIG. 1a is a schematic architecture view showing an exemplary display device.

In the description of this disclosure, it is to be understood that the terms "up", "down", "front", "back", "left", "right", "vertical", "horizontal", "top", "bottom", "inside" and "outside" indicating the orientation or position relationships are the orientation or position relationships based on the drawing, are only provided for the purposes of describing this disclosure and simplifying the description, but do not indicate or imply that the directed devices or elements must have the specific orientations or be constructed and operated in the specific orientations, and thus cannot be understood as the restriction to this disclosure.

In the drawings, the thickness of layers, films, panels, areas and the line are exaggerated for clarity. In the drawings, the thickness of some layers and areas is exaggerated for clarity and ease of description. It will be understood that when an element such as a layer, film, area or substrate is referred to as being "on" another element, the same may be directly on the other element, or intervening elements may also be present.

Also, in the specification, unless explicitly described to the contrary, the word "including" will be understood to mean encompassing the element, but not excluding any other element. In addition, in the specification, "on" means above or below a target group component, but does not mean that it must be on a top based on the direction of gravitational force.

In order to further illustrate the technical means and effects of this disclosure in order to achieve the intended purpose of this invention, the specific embodiment, structure, characteristic and effect of a display panel and display device applying the same according to this disclosure will be described in the following with reference to the accompanying drawings and embodiments.

FIG. 1a is a schematic architecture view showing an exemplary display device. Referring to FIG. 1a, a display device 200 includes: a control board 100, which includes a timing controller (TCON) 101; a printed circuit board 103 connected to the control board 100 through a flexible flat cable (FFC) 102; a source driving unit 104 and a gate driving unit 105, which are disposed in a wiring area 109 and connected to a data line 104a and a gate line 105a inside a display area 106, respectively. In some embodiments, the gate driving unit 105 and the source driving unit 104 include, but without limitation to, a COF form.

The drive mode of the display device 200 includes providing, by a system mainboard, a color (such as R/G/B) compression signal, a control signal and a power transmitted to the control board 100. After the timing controller (TCON) 101 on the control board 100 processes these signals, the processed signals are transmitted to the gate driving unit 105 and the source driving unit 104 of the printed circuit board 103 together with the power processed by the drive circuit through the FFC 102. The gate driving unit 105 and the source driving unit 104 transmit the necessary data and power to the display area 106, so that the display device 200 obtains the power and the signal required for displaying the frame.

Figure 1B:
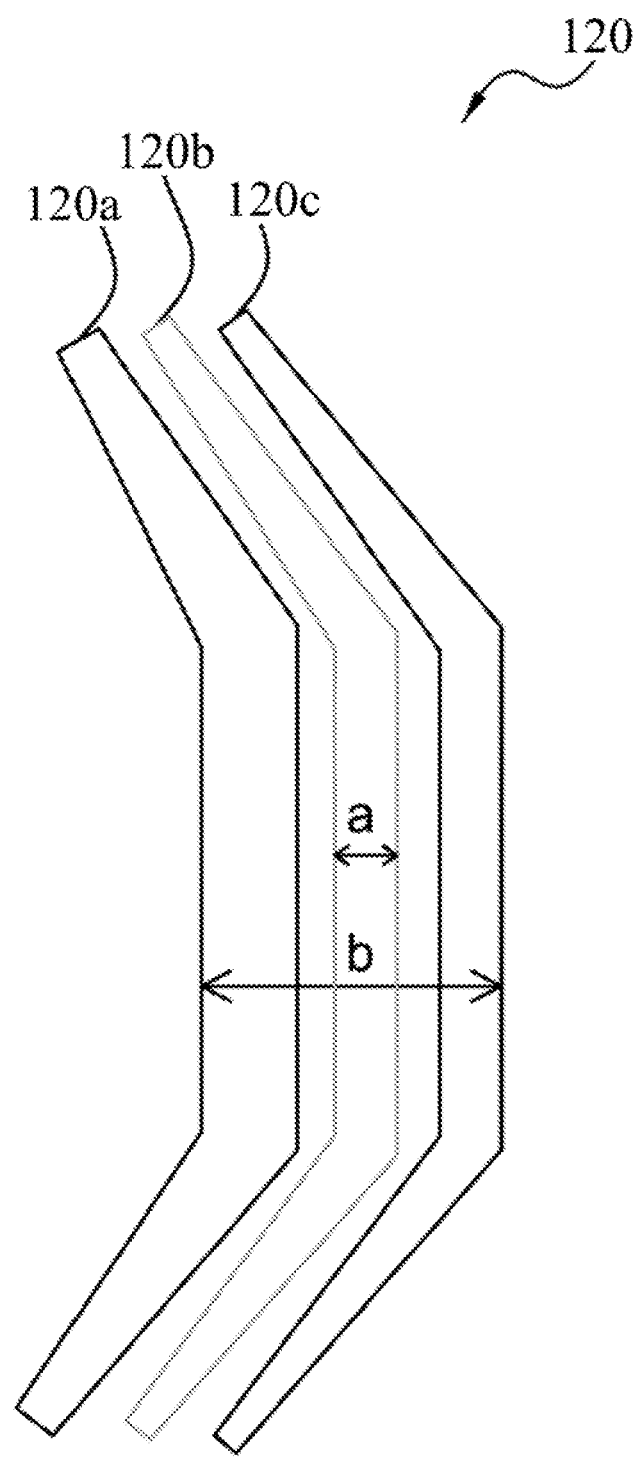
FIG. 1b is a schematic trace view showing a wire array of the exemplary display panel.

FIG. 1b is a schematic trace view showing an exemplary wire array. The understanding is facilitated with reference to FIG. 1b in view of FIG. 1a. In some embodiments, the circuits, such as the driving units (104, 105), the gate line 105a and the data line 104a and the like, are formed on the same display substrate. The display substrate and the driving units (104, 105) for transmitting the drive signal are connected together by using the WOA 120. In general, the WOA 120 includes: a type A trace 120a for transmitting the common voltage; a type B trace 120b for supplying a power drive signal to a chip; and a type C trace 120c for supplying a work signal to the chip.

However, a signal of the gate line 105a is transferred to each layer of the chip and integrated circuit (IC) of the gate driving unit 105 in a layer-by-layer manner through the WOA 120. Thus, the power drive signal provided to the chip/integrated circuit through the type B trace 120b cannot have the serious distortion. In the actual use, however, since the WOA 120 between the gate driving units 105 (such as Gate to Gate, G-G) has an impedance, the longer the WOA 120 is, the greater the corresponding impedance value is, and this will show the signal climbing and amplitude. So in the design, the resistance value of the type B trace 120b for the chips/integrated circuits needs to be decreased.

Figure 1C:
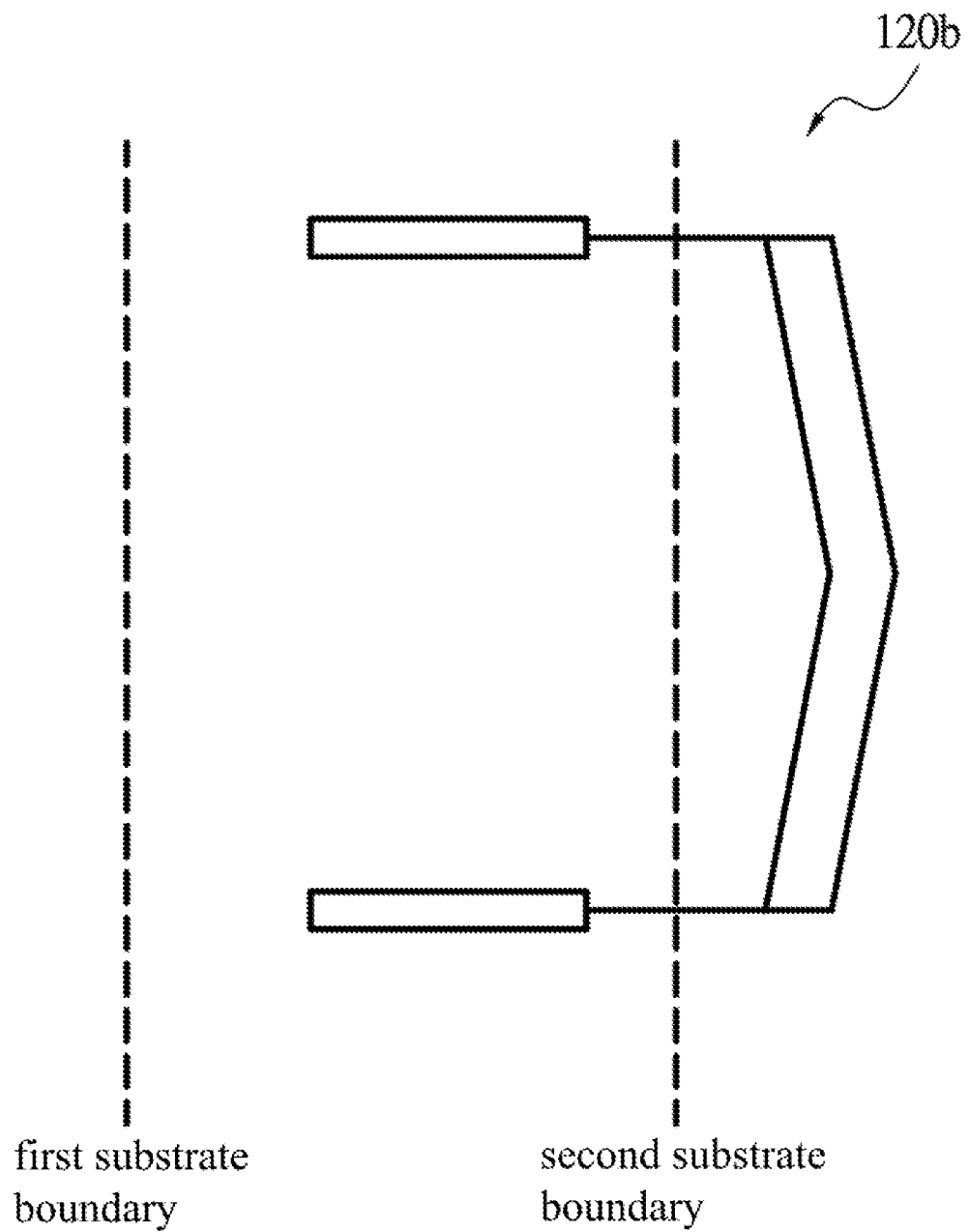
FIG. 1c is a schematic view showing the type B trace in the exemplary display panel.
Figure 1D:
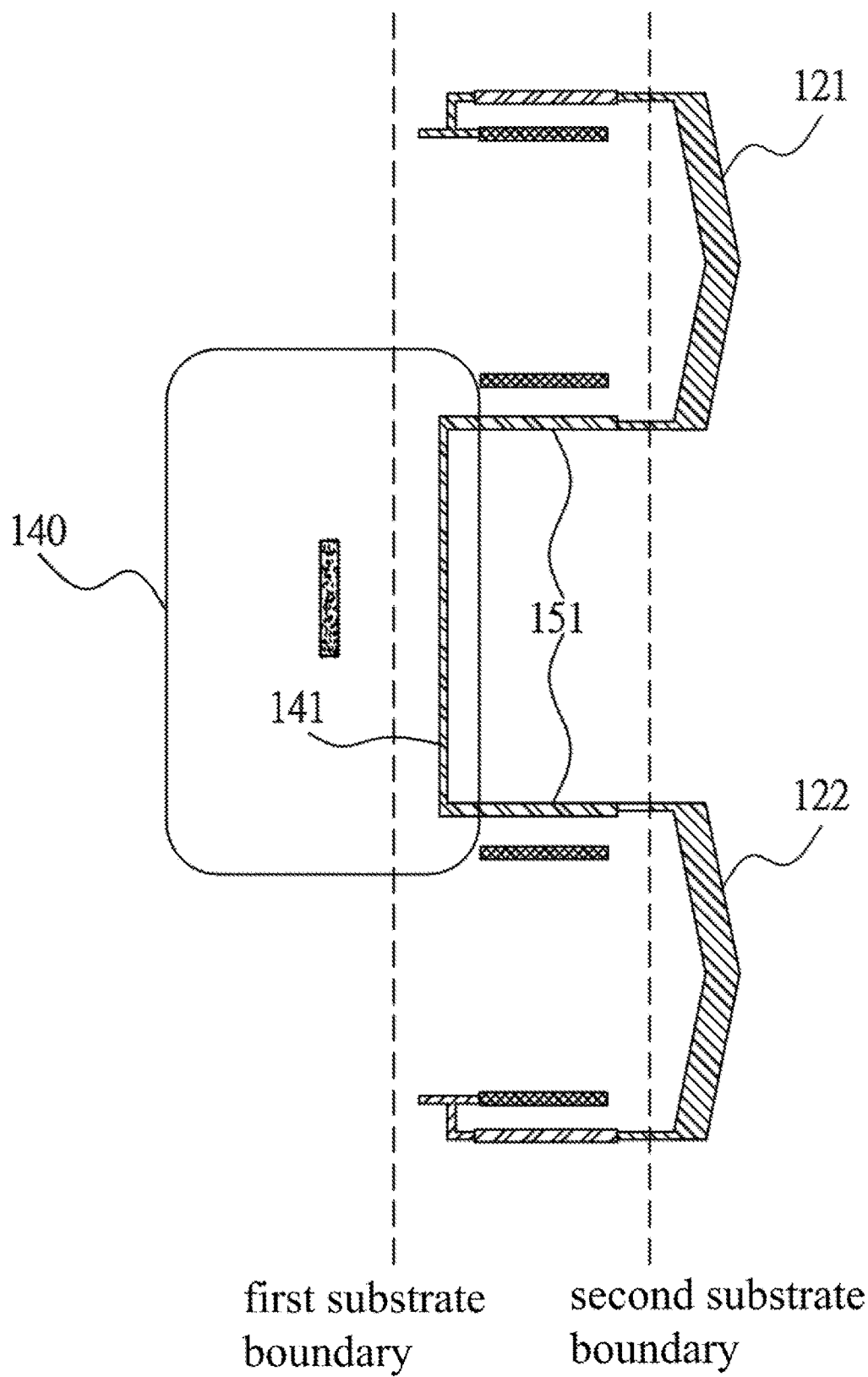
FIG. 1d is a schematic design view showing the type B trace of the exemplary display panel working in conjunction with the trace of the flexible circuit board.

FIG. 1c is a schematic view showing the type B trace in the exemplary display panel, and FIG. 1d is a schematic design view showing the type B trace of the exemplary display panel working in conjunction with the trace of the flexible circuit board. Please refer to FIG. 1c, which shows the WOA structure (type B trace 120b) of the exemplary display panel, which includes a plurality of drive line portions (type B traces 120b), and each of the drive line portions includes a plurality of circuit leads and interface units. Please also refer to FIG. 1d, which shows the trace structure of the WOA of the exemplary display panel working in conjunction with a flexible circuit board 140. The WOA (type B trace 120b) includes a first drive line portion 121 and a second drive line portion 122, both of which are disposed in a surrounding wiring area 109 of the first substrate. A first wire 141 bridging the circuit leads of the first drive line portion 121 to the second drive line portion 122 through the first interface unit 151 is disposed on the flexible circuit board 140, so that the first wire 141 serves as the extension wires of the first drive line portion 121 and the second drive line portion 122 to expand line widths and areas of three of them and to decrease the resistance value of the drive line portion. However, for the display having the larger size and the narrower border, the existing type B trace 120b has the configurable space with the smaller width and the longer distance. For the existing extension wire design, the resistance value of the type B trace 120b is still inevitably increased.

Figure 2:
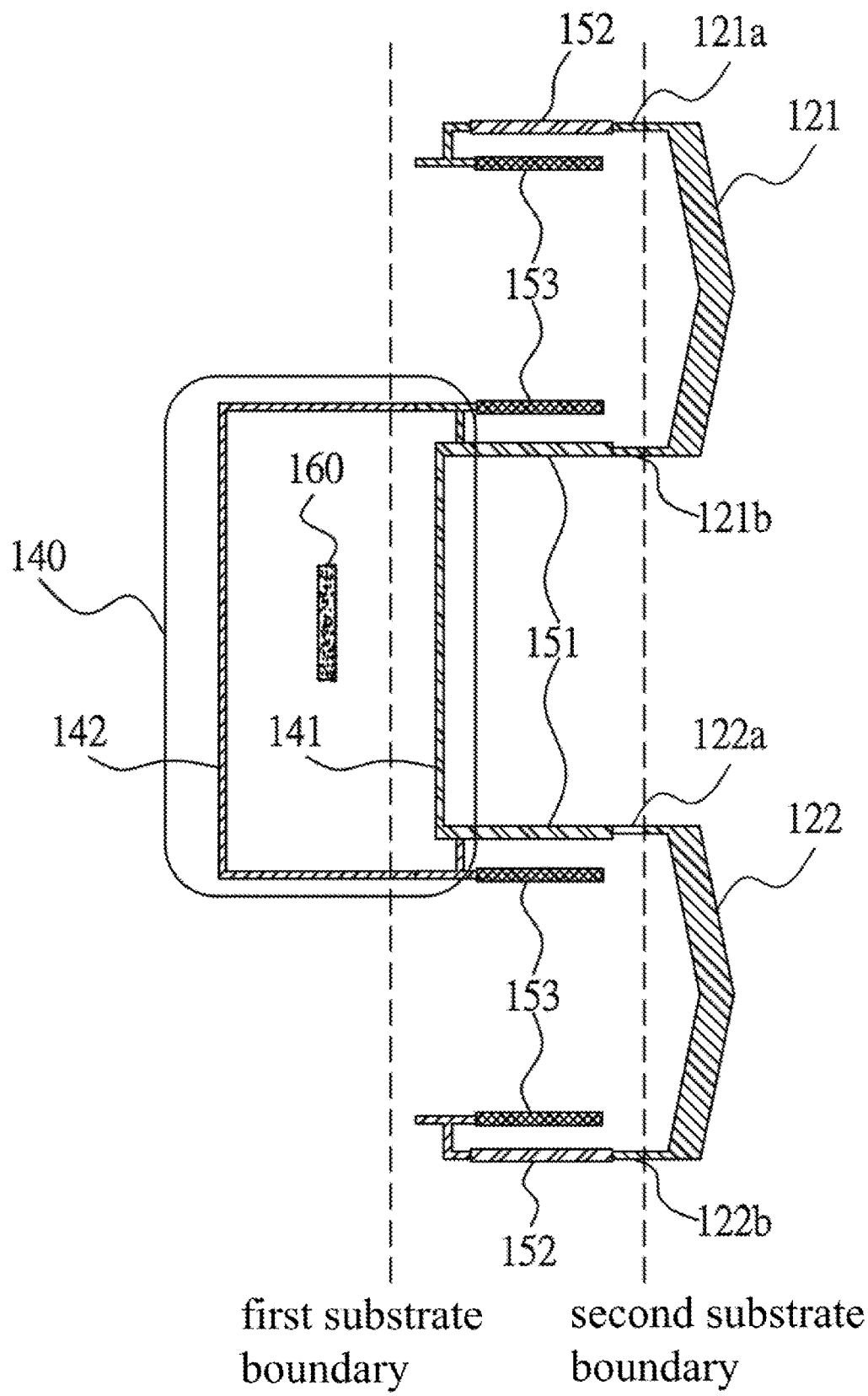
FIG. 2 is a schematic design view showing the type B trace of the display panel working in conjunction with the trace of the flexible circuit board according to an embodiment of this disclosure.

FIG. 2 is a schematic design view showing the type B trace of the display panel working in conjunction with the trace of the flexible circuit board according to an embodiment of this disclosure.

Referring to FIG. 2, in one embodiment of the disclosure, a display panel includes: a first substrate including a display area and a peripheral wiring area surrounding the display area, wherein a plurality of active switches and a plurality of pixel units are disposed in the display area of the first substrate, and the pixel units are respectively coupled to the active switches; a second substrate disposed opposite the first substrate; a first drive line portion 121 disposed in the wiring area of the first substrate; a second drive line portion 122 disposed in the wiring area of the first substrate; a flexible circuit board 140 including a first wire 141; a first interface unit 151 respectively connecting the first wire 141 to the first drive line portion 121 and the second drive line portion 122; wherein the flexible circuit board 140 includes a second wire 142, and the second wire 142 and the first wire 141 are connected in parallel to form parallel wires. Thus, the parallel wires serve as the extension wires of the first drive line portion 121 and the second drive line portion 122 to expand line widths and areas of three of them. In addition, the resistance value of the drive line portion can be relatively decreased in an assisted manner according to the parallel impedance principle of the parallel wires.

In some embodiments, the flexible circuit board 140 is a flexible printed circuit film or a flexible printed circuit board.

In some embodiments, the second wire 142 is respectively electrically coupled to a plurality of virtual bit interface units 153 and the first interface unit 151.

In some embodiments, the second wire 142 is electrically coupled to the virtual bit interface units 153 and the first interface unit 151 by way of single-layer metal wiring.

In some embodiments, the second wire 142 is electrically coupled to the virtual bit interface units 153 and the first interface unit 151 by way of dual-layer metal wiring.

In some embodiments, the first drive line portion 121 includes a first circuit lead 121a and a second circuit lead 121b. The second drive line portion 122 includes a first circuit lead 122a and a second circuit lead 122b. The first interface unit 151 respectively bridges the second circuit lead 121b of the first drive line portion 121 to the first circuit lead 122a of the second drive line portion 122. The first circuit lead 121a of the first drive line portion 121 and the second circuit lead 122b of the second drive line portion 122 are respectively electrically coupled to a plurality of virtual bit interface units 153 through the second interface unit 152.

In some embodiments, the second interface unit 152 and the virtual bit interface units 153 are configured by way of single-layer metal wiring.

In some embodiments, the second interface unit 152 and the virtual bit interface units 153 are configured by way of dual-layer metal wiring.

In some embodiments, when the first wire 141 respectively bridges first drive line portion 121 to the second drive line portion 122, an edge of the first substrate is disposed between the first drive line portion 121 and the first interface unit 151 and disposed between the second drive line portion 122 and the first interface unit 151.

In some embodiments, the first drive line portion 121 and the second drive line portion 122 are electrically coupled to a drive chip 160.

In some embodiments, the drive chip 160 is a source drive chip or a gate drive chip.

In some embodiments, the drive chip 160 is disposed on the flexible circuit board 140.

In some embodiments, materials of the first interface unit 151, the second interface unit 152 and the virtual bit interface units 153 are selected from a group consisting of aluminum, molybdenum, chromium and alloys of aluminum, molybdenum and chromium.

Figure 3:
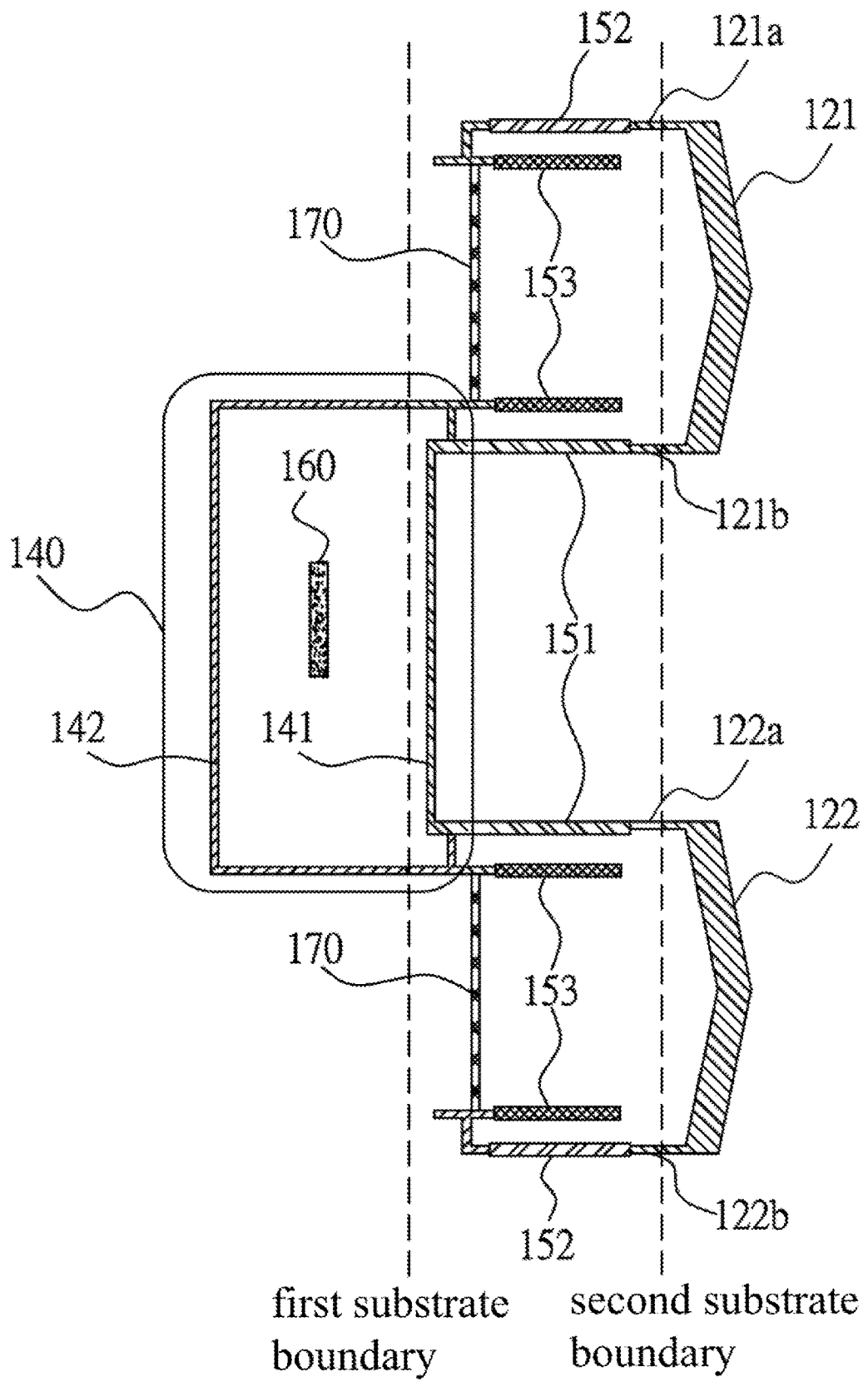
FIG. 3 is a schematic design view showing the type B trace of the display panel working in conjunction with the trace of the flexible circuit board according to an embodiment of this disclosure.

FIG. 3 is a schematic design view showing the type B trace of the display panel working in conjunction with the trace of the flexible circuit board according to an embodiment of this disclosure.

Referring to FIG. 3, in one embodiment of the disclosure, the display panel includes: a first substrate including a display area and a wiring area, wherein a plurality of active switches and a plurality of pixel units are disposed in the display area of the first substrate, and the pixel units are respectively coupled to the active switches; a second substrate disposed opposite the first substrate; a first drive line portion 121 disposed in the wiring area of the first substrate; a second drive line portion 122 disposed in the wiring area of the first substrate; a flexible circuit board 140 including a first wire 141 and a second wire 142, wherein the second wire 142 and the first wire 141 are connected in parallel to form parallel wires; and a first interface unit 151 respectively connecting the first wire 141 to the first drive line portion 121 and the second drive line portion 122. The first drive line portion 121 and the second drive line portion 122 are respectively electrically coupled to a plurality of impedance decreasing wires 170 through the first interface unit 151 and the second interface unit 152, so that the resistance value of the type B trace 120b is decreased to the larger limit.

Figure 4:
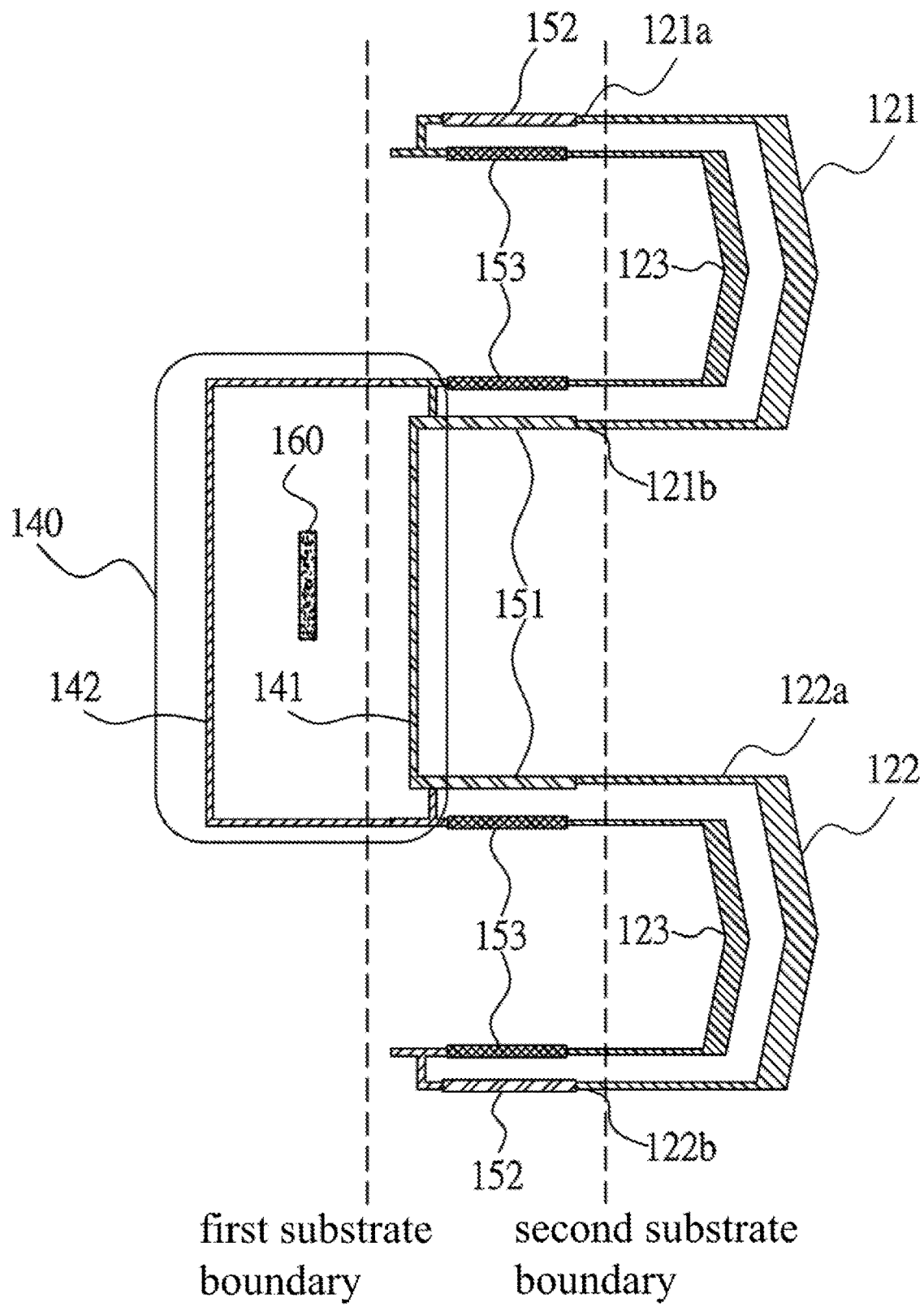
FIG. 4 is a schematic design view showing the type B trace of the display panel working in conjunction with the trace of the flexible circuit board according to an embodiment of this disclosure.

FIG. 4 is a schematic design view showing the type B trace of the display panel working in conjunction with the trace of the flexible circuit board according to an embodiment of this disclosure.

Referring to FIG. 4, in one embodiment of the disclosure, the display panel includes: a first substrate including a display area and a wiring area, wherein a plurality of active switches and a plurality of pixel units are disposed in the display area of the first substrate, and the pixel units are respectively coupled to the active switches; a first drive line portion 121 disposed in the wiring area of the first substrate; a second drive line portion 122 disposed in the wiring area of the first substrate; a flexible circuit board 140 including a first wire 141 and a second wire 142, wherein the second wire 142 and the first wire 141 are connected in parallel to form parallel wires; and a first interface unit 151 respectively connecting the first wire 141 to the first drive line portion 121 and the second drive line portion 122. The first drive line portion 121 and the second drive line portion 122 are respectively electrically coupled to a plurality of virtual bit interface units 153 through the first interface unit 151 and the second interface unit 152, and the third drive line portions 123 are respectively electrically coupled to a plurality of virtual bit interface units 153 to from parallel circuits together with the first drive line portion 121 and the second drive line portion 122, respectively. Thus, the resistance value of the drive line portion can be relatively decreased in an assisted manner according to the parallel impedance principle of the parallel wires.

Figure 5:
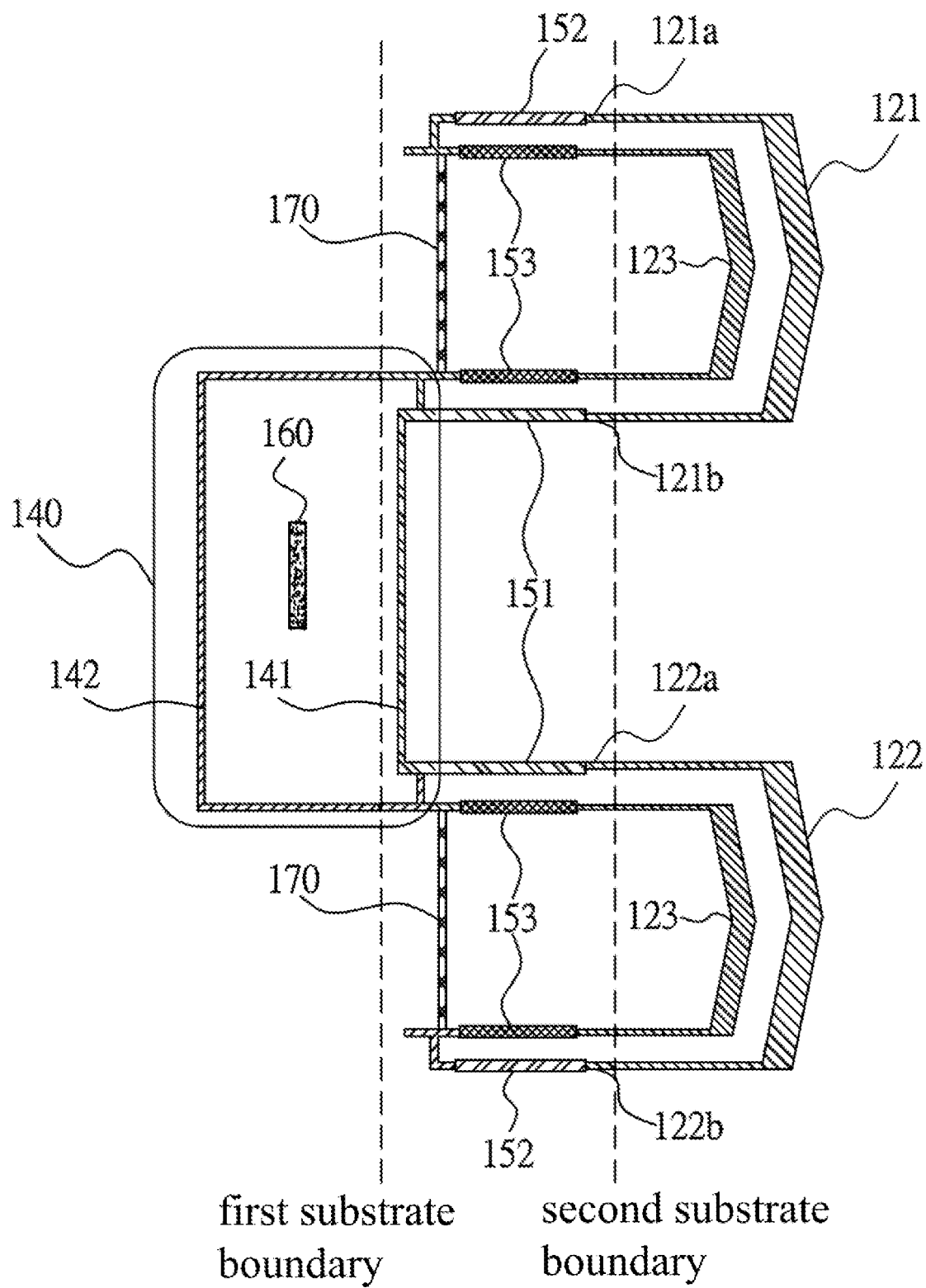
FIG. 5 is a schematic design view showing the type B trace of the display panel working in conjunction with the trace of the flexible circuit board according to an embodiment of this disclosure.

FIG. 5 is a schematic design view showing the type B trace of the display panel working in conjunction with the trace of the flexible circuit board according to an embodiment of this disclosure.

Referring to FIG. 5, in one embodiment of the disclosure, the display panel includes: a first substrate including a display area and a wiring area, wherein a plurality of active switches and a plurality of pixel units are disposed in the display area of the first substrate, and the pixel units are respectively coupled to the active switches; a second drive line portion 122 disposed in the wiring area; a first drive line portion 121 disposed in the wiring area; a flexible circuit board 140 including a first wire 141 and a second wire 142, wherein the second wire 142 and the first wire 141 are connected in parallel to form parallel wires; and a first interface unit 151 respectively connecting the first wire 141 to the first drive line portion 121 and the second drive line portion 122. The first drive line portion 121 and the second drive line portion 122 are respectively electrically coupled to a plurality of impedance decreasing wires 170 through the first interface unit 151 and the second interface unit 152. In addition, the first drive line portion 121 and the second drive line portion 122 are respectively electrically coupled to a plurality of virtual bit interface units 153 through the first interface unit 151 and the second interface unit 152. The third drive line portions 123 are respectively electrically coupled to a plurality of virtual bit interface units 153 to form parallel circuits together with the first drive line portion 121 and the second drive line portion 122, respectively. Thus, the resistance value of the drive line portion can be relatively decreased in an assisted manner through the impedance decreasing wire 170 and the parallel impedance principle of the parallel wires.

Figure 6:
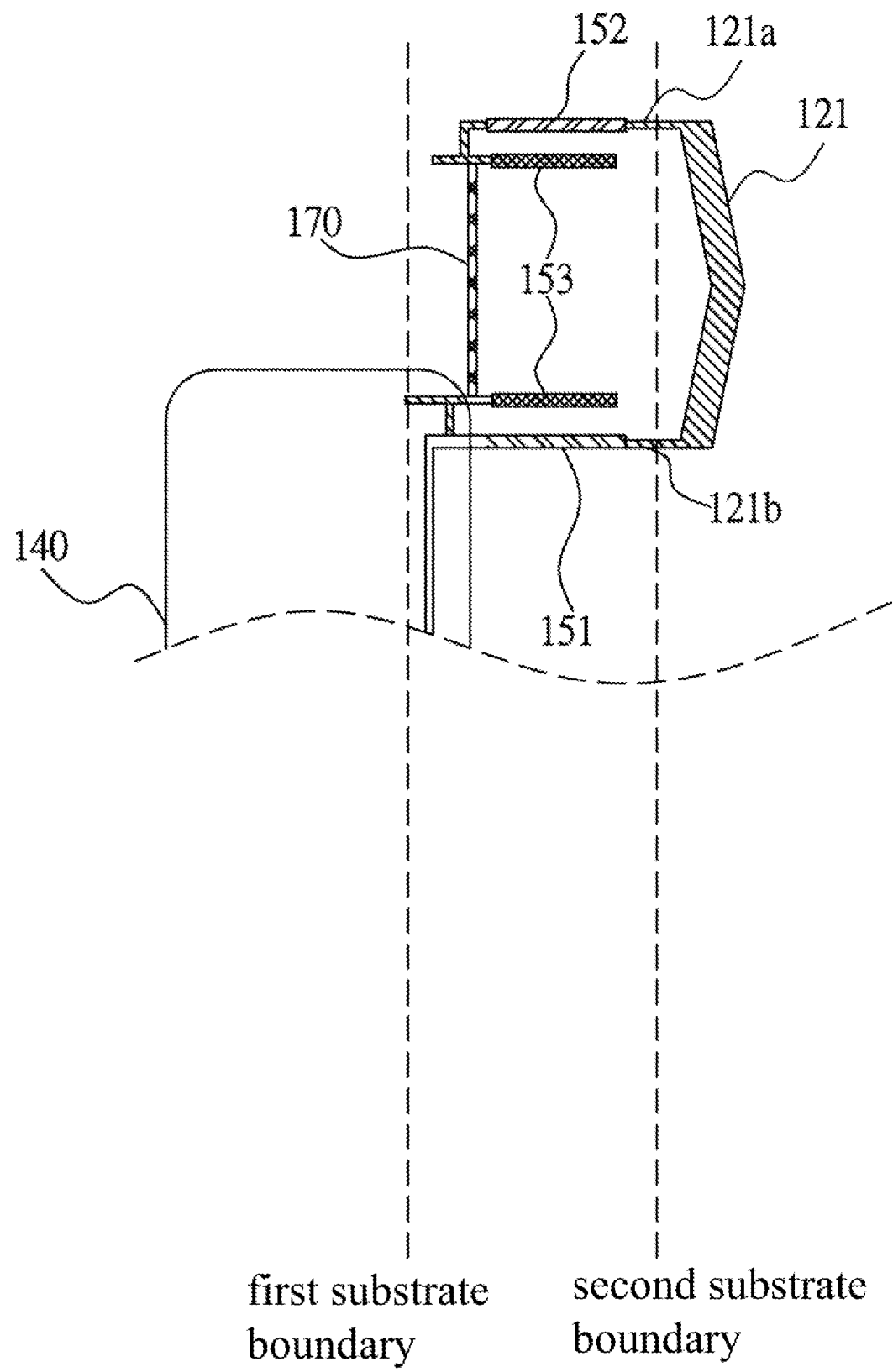
FIG. 6 is a schematic design view showing the type B trace of the display panel working in conjunction with the trace of the flexible circuit board according to an embodiment of this disclosure.

FIG. 6 is a schematic design view showing the type B trace of the display panel working in conjunction with the trace of the flexible circuit board according to an embodiment of this disclosure.

Referring to FIG. 6, in one embodiment of the disclosure, the display panel includes: a first substrate including a display area and a wiring area, wherein a plurality of active switches and a plurality of pixel units are disposed in the display area of the first substrate, and the pixel units are respectively coupled to the active switches; and a first drive line portion 121 disposed in the wiring area. The first drive line portion 121 is respectively electrically coupled to a first interface unit 151 and a second interface unit 152, and an impedance decreasing wire 170 is disposed between the first interface unit 151 and the second interface unit 152.

Figure 7:
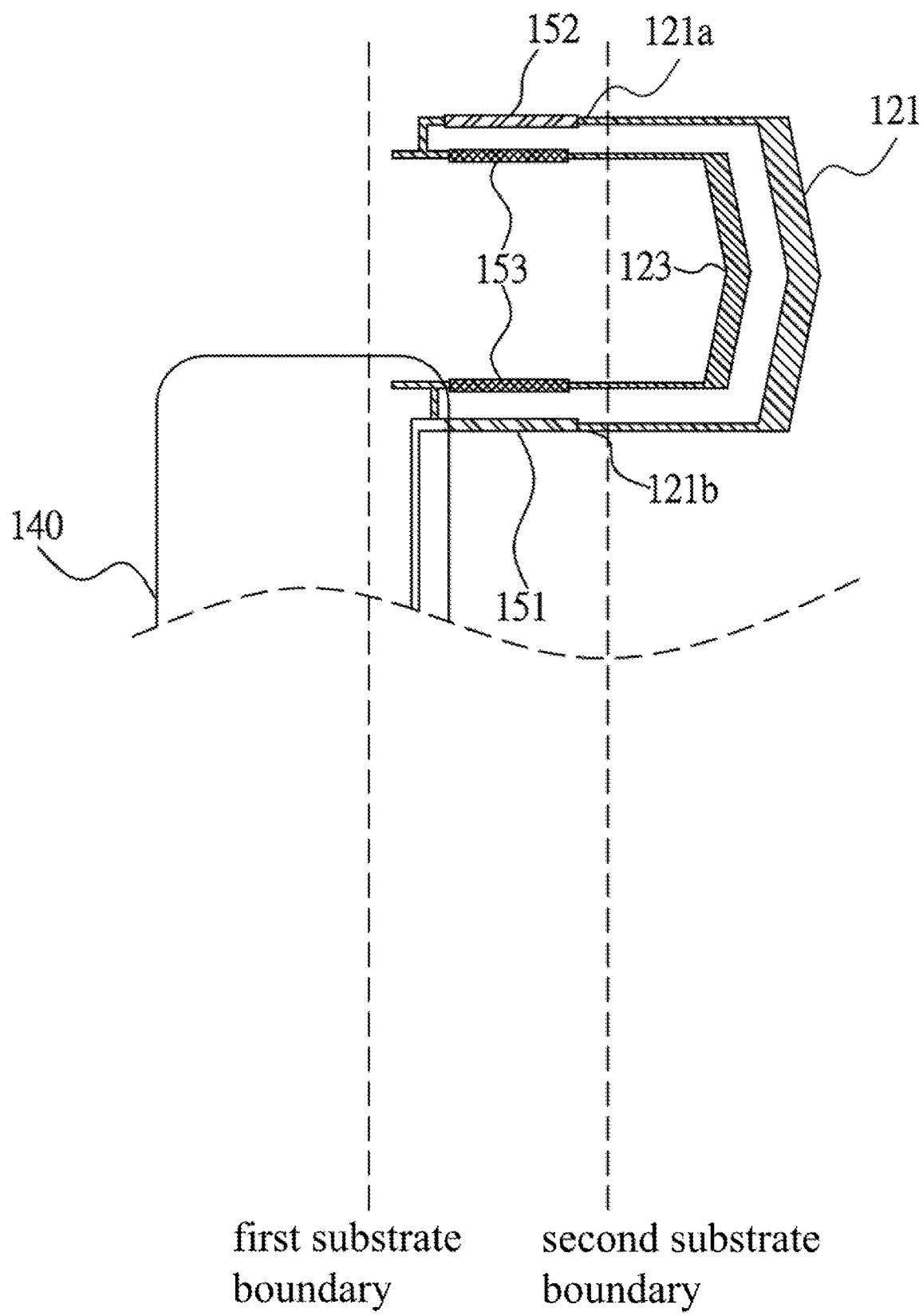
FIG. 7 is a schematic design view showing the type B trace of the display panel working in conjunction with the trace of the flexible circuit board according to an embodiment of this disclosure.

FIG. 7 is a schematic design view showing the type B trace of the display panel working in conjunction with the trace of the flexible circuit board according to an embodiment of this disclosure.

Referring to FIG. 7, in one embodiment of the disclosure, the display panel includes: a first substrate including a display area and a wiring area, wherein a plurality of active switches and a plurality of pixel units are disposed in the display area of the first substrate, and the pixel units are respectively coupled to the active switches; and a first drive line portion 121 disposed in the wiring area. The first drive line portion 121 is electrically coupled to a plurality of virtual bit interface units 153 through a first interface unit 151 and a second interface unit 152. A third drive line portion 123 is respectively electrically coupled to a plurality of virtual bit interface units 153 to form parallel circuits together with the first drive line portion 121.

Figure 8:
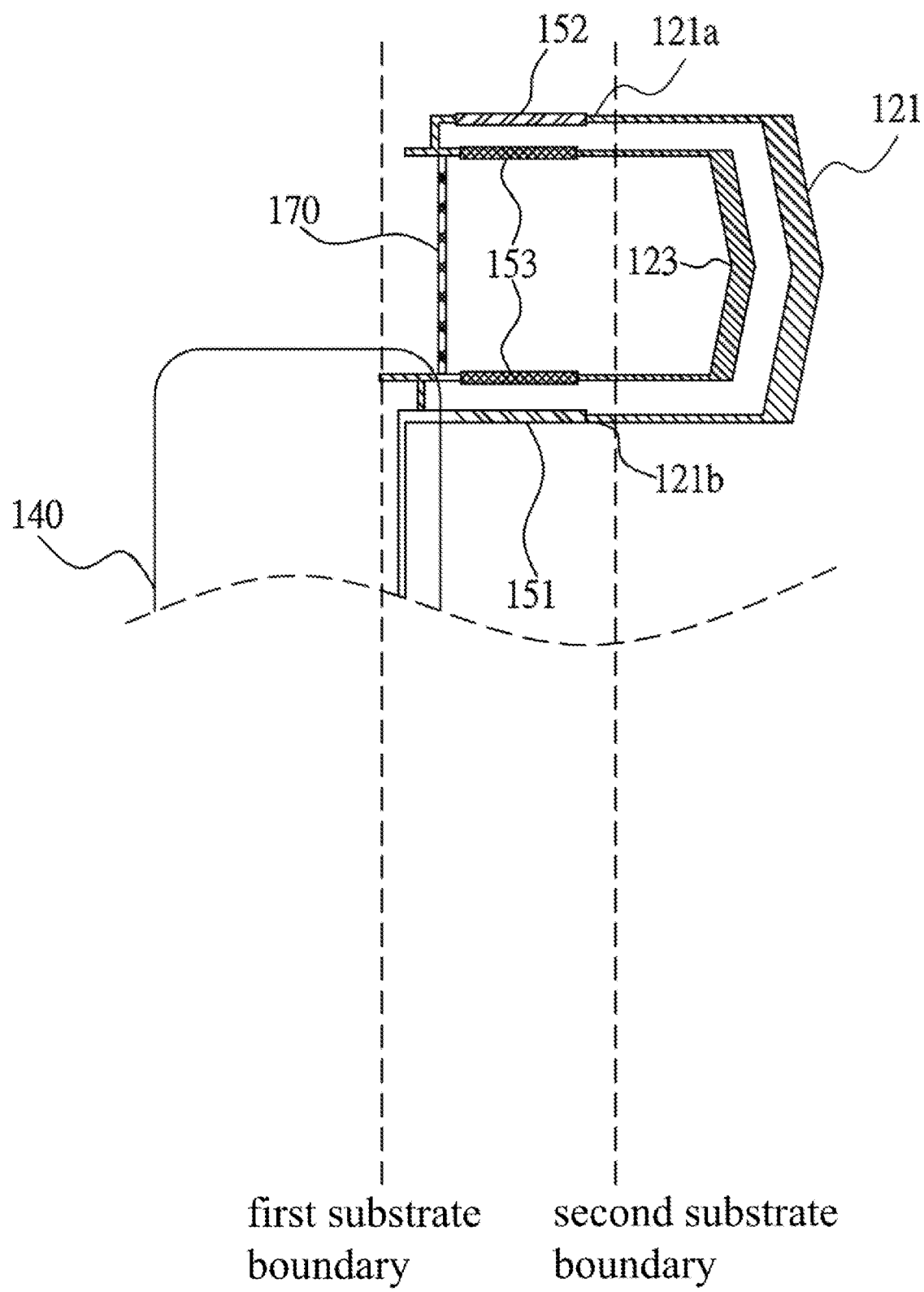
FIG. 8 is a schematic design view showing the type B trace of the display panel working in conjunction with the trace of the flexible circuit board according to an embodiment of this disclosure.

FIG. 8 is a schematic design view showing the type B trace of the display panel working in conjunction with the trace of the flexible circuit board according to an embodiment of this disclosure.

Referring to FIG. 8, in one embodiment of the disclosure, the display panel includes: a first substrate including a display area and a wiring area, wherein a plurality of active switches and a plurality of pixel units are disposed in the display area of the first substrate, and the pixel units are respectively coupled to the active switches; and a first drive line portion 121 disposed in the wiring area. The first drive line portion 121 is electrically coupled to a plurality of virtual bit interface units 153 through a first interface unit 151 and a second interface unit 152. A third drive line portion 123 is respectively electrically coupled to a plurality of virtual bit interface units 153 to form parallel circuits together with the first drive line portion 121. An impedance decreasing wire 170 is disposed between the first interface unit 151 and the second interface unit 152.

Figure 9:
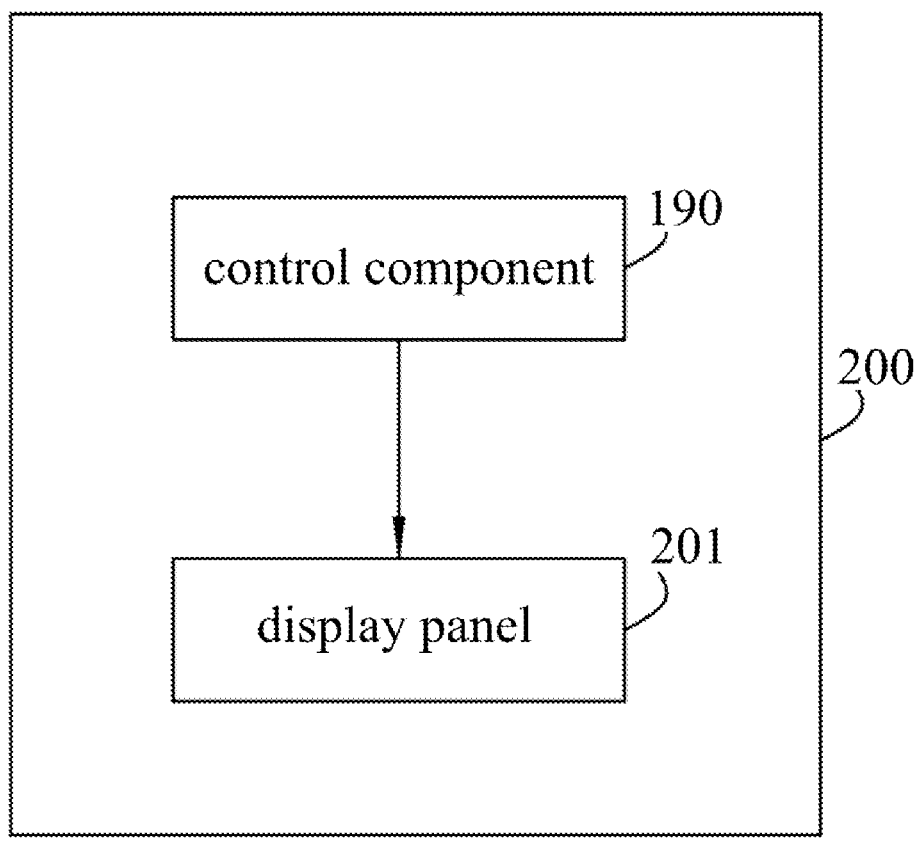
FIG. 9 is a schematic architecture view showing a display device according to an embodiment of this disclosure.

FIG. 9 is a schematic architecture view showing a display device according to an embodiment of this disclosure. Referring to FIGS. 2 to 8, a display device 200 in one embodiment of this disclosure includes: a control component 190 transmitting a common voltage, a drive power and a work signal through transmission wire, wherein the control component 190 includes, for example but without limitation to, the previously described timing module, source driving unit 104 and gate driving unit 105; and a display panel 201 of any of the above embodiments.

In some embodiments, the display panel of this disclosure can be, for example, a liquid crystal display panel, but this disclosure is not limited thereto. The display panel of this disclosure can also be an OLED display panel, a W-OLED display panel, a QLED display panel, a plasma display panel, a curved display panel, or any other kinds of display panels.

This disclosure can decrease the resistance value of the type B trace of the WOA in the narrow border, enhancing the product quality and the product reliability, and lengthening the lifetime.

The terms "in some embodiments" and "in various embodiments" are used repeatedly. The terms generally do not refer to the same embodiment; but it may also refer to the same embodiment. The words "include", "possess" and "comprise" are synonyms, unless its contexts show other meanings.

Although the invention has been described with reference to specific embodiments, this description is not meant to be construed in a limiting sense. Various modifications of the disclosed embodiments, as well as alternative embodiments, will be apparent to persons skilled in the art. It is, therefore, contemplated that the appended claims will cover all modifications that fall within the true scope of the invention.

What is claimed is:

1. A display panel, comprising:
   a first substrate including a display area and a wiring area, wherein a plurality of active switches and a plurality of pixel units are disposed in the display area of the first substrate, and the pixel units are respectively coupled to the active switches;
   a second substrate disposed opposite the first substrate;
   a first drive line portion disposed in the wiring area of the first substrate;
   a second drive line portion disposed in the wiring area of the first substrate;
   a flexible circuit board including a first wire; and
   a first interface unit respectively connecting the first wire to the first drive line portion and the second drive line portion;
   wherein the flexible circuit board comprises a second wire, and the second wire is connected to the first wire in parallel to form parallel circuits,
   wherein the second wire is respectively electrically coupled to a plurality of virtual bit interface units and the first interface unit.

2. The display panel according to claim 1, wherein the second wire is electrically coupled to the virtual bit interface units and the first interface unit by way of single-layer metal wiring or dual-layer metal wiring.

3. The display panel according to claim 1, wherein the first drive line portion comprises a first circuit lead and a second circuit lead, the second drive line portion comprises a first circuit lead and a second circuit lead, the first wire bridges the second circuit lead of the first drive line portion and the first circuit lead of the second drive line portion; and the first circuit lead of the first drive line portion and the second circuit lead of the second drive line portion are electrically coupled to the virtual bit interface units through a second interface unit.

4. The display panel according to claim 3, wherein the second interface unit and the virtual bit interface units are configured by way of single-layer metal wiring or dual-layer metal wiring.

5. The display panel according to claim 3, wherein the first drive line portion and the second drive line portion are respectively electrically coupled to a plurality of impedance decreasing wires through the first interface unit and the second interface unit.

6. The display panel according to claim 3, wherein a material of the second interface unit is selected from a group consisting of aluminum, molybdenum, chromium and alloys of aluminum, molybdenum and chromium.

7. The display panel according to claim 1, wherein when the first wire bridges the first drive line portion and the second drive line portion, an edge of the first substrate is located between the first drive line portion and the first interface unit, and between the second drive line portion and the first interface unit.

8. The display panel according to claim 1, wherein the first drive line portion and the second drive line portion are electrically coupled to a drive chip, and the drive chip is a source drive chip or a gate drive chip.

9. The display panel according to claim 8, wherein the drive chip is disposed on the flexible circuit board.

10. The display panel according to claim 1, further comprising:
    a plurality of third drive line portions electrically coupled to the virtual bit interface units to form parallel circuits with the first drive line portion and the second drive line portion.

11. The display panel according to claim 1, wherein the flexible circuit board is a flexible printed circuit film or a flexible printed circuit board.

12. The display panel according to claim 1, wherein materials of the first interface unit and the virtual bit interface units are selected from a group consisting of aluminum, molybdenum, chromium and alloys of aluminum, molybdenum and chromium.

13. A display device, comprising:
    a control component; and
    a display panel according to claim 1.

14. A display panel, comprising:
    a first substrate including a display area and a wiring area, wherein a plurality of active switches and a plurality of pixel units are disposed in the display area of the first substrate, and the pixel units are respectively coupled to the active switches;
    a second substrate disposed opposite the first substrate;

a first drive line portion disposed in the wiring area of the first substrate;

a second drive line portion disposed in the wiring area of the first substrate;

a flexible circuit board including a first wire and a second wire, wherein the second wire is connected to the first wire in parallel to form parallel circuits; and a first interface unit respectively connecting the first wire to the first drive line portion and the second drive line portion;

wherein the first drive line portion comprises a first circuit lead and a second circuit lead, the second drive line portion comprises a first circuit lead and a second circuit lead, the first wire bridges the second circuit lead of the first drive line portion and the first circuit lead of the second drive line portion; and the first circuit lead of the first drive line portion and the second circuit lead of the second drive line portion are electrically coupled to a virtual bit interface units through a second interface unit;

the first drive line portion and the second drive line portion are respectively electrically coupled to a plurality of impedance decreasing wires through the first interface unit and the second interface unit; and a plurality of third drive line portions are electrically coupled to the virtual bit interface units to form parallel circuits with the first drive line portion and the second drive line portion.

15. The display panel according to claim 14, wherein a second wire is respectively electrically coupled to a plurality of virtual bit interface units and the first interface unit.

16. The display panel according to claim 15, wherein the second wire is electrically coupled to the virtual bit interface units and the first interface unit by way of single-layer metal wiring or dual-layer metal wiring.

17. The display panel according to claim 14, wherein the second interface unit and the virtual bit interface units are configured by way of single-layer metal wiring or dual-layer metal wiring.

18. The display panel according to claim 14, wherein when the first wire bridges the first drive line portion and the second drive line portion, an edge of the first substrate is located between the first drive line portion and the first interface unit, and between the second drive line portion and the first interface unit.

19. The display panel according to claim 14, wherein the first drive line portion and the second drive line portion are electrically coupled to a drive chip, and the drive chip is a source drive chip or a gate drive chip.

\* \* \* \* \*